(12) United States Patent
Schreck et al.

(10) Patent No.: US 8,130,585 B2
(45) Date of Patent: *Mar. 6, 2012

(54) SYSTEM AND METHOD FOR HIDDEN-REFRESH RATE MODIFICATION

(75) Inventors: John Schreck, Lucas, TX (US); John R. Wilford, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/464,386

(22) Filed: May 12, 2009

(65) Prior Publication Data

US 2009/0225617 A1 Sep. 10, 2009

Related U.S. Application Data (63) Continuation of application No. 11/140,791, filed on May 31, 2005, now Pat. No. 7,532,532.

(51) Int. Cl.
G11C 7/00 (2006.01)
(52) U.S. Cl. ............... 365/222; 365/233.12; 365/233.15
(58) Field of Classification Search .............. 365/222 O, 365/233.12 X, 233.15 X, 222, 233.12, 233.15
See application file for complete search history.

(56) References Cited

U.S. PATENT DOCUMENTS

| | | | |
|---|---|---|---|
| 4,549,284 A | 10/1985 | Ikuzaki | |
| 5,075,886 A | 12/1991 | Isobe et al. | |
| 5,206,830 A | 4/1993 | Isobe et al. | |
| 5,446,695 A * | 8/1995 | Douse et al. | 365/222 |
| 5,544,120 A | 8/1996 | Kuwagata et al. | |
| 5,586,287 A | 12/1996 | Okumura et al. | |
| 5,617,551 A | 4/1997 | Corder | |
| 5,703,832 A * | 12/1997 | Ting et al. | 365/189.08 |
| 5,808,952 A | 9/1998 | Fung et al. | |
| 5,848,247 A | 12/1998 | Matsui et al. | |
| 6,028,804 A | 2/2000 | Leung | |
| 6,049,844 A | 4/2000 | Matsui et al. | |
| 6,134,167 A | 10/2000 | Atkinson | |

(Continued)

FOREIGN PATENT DOCUMENTS

EP 1530218 5/2005

OTHER PUBLICATIONS

"Async/Page Cellular RAM 1.0 Memory," Micron Technology, Inc., 2003, 34 pages.

(Continued)

*Primary Examiner* — VanThu Nguyen
(74) *Attorney, Agent, or Firm* — TraskBritt (57) ABSTRACT

A system and method for modifying a hidden-refresh rate for dynamic memory cells includes monitoring a control signal from a processor and performing a hidden-refresh of dynamic data at a first refresh rate when the control signal is asserted. The dynamic data is refreshed at a second refresh rate when the control signal is deasserted for a predetermined duration. A hidden-refresh controller couples to an array of dynamic memory cells during a hidden-refresh of the array of dynamic memory cells. The hidden-refresh controller is further configured to monitor a control signal identifying a request from a processor at a memory device and refresh the dynamic data at a first refresh rate when the control signal is asserted. The hidden-refresh controller is further configured to refresh the dynamic data at a second refresh rate when the control signal is deasserted for a predetermined duration.

18 Claims, 8 Drawing Sheets

U.S. PATENT DOCUMENTS

| | | |
|---|---|---|
| 6,282,606 B1 | 8/2001 | Holland |
| 6,334,167 B1 * | 12/2001 | Gerchman et al. ............ 711/106 |
| 6,594,720 B1 | 7/2003 | Matsui et al. |
| 6,625,077 B2 | 9/2003 | Chen |
| 6,646,942 B2 | 11/2003 | Janzen |
| 6,693,838 B2 | 2/2004 | Hagura et al. |
| 6,697,910 B2 * | 2/2004 | Tsukude et al. ............. 711/106 |
| 6,721,224 B2 | 4/2004 | Eaton et al. |
| 6,721,225 B2 | 4/2004 | Tsukude |
| 6,792,493 B2 | 9/2004 | Matsui et al. |
| 6,795,361 B2 | 9/2004 | Joo |
| 6,795,364 B1 | 9/2004 | Leung et al. |
| 6,834,021 B2 | 12/2004 | Mori et al. |
| 6,847,572 B2 | 1/2005 | Lee et al. |
| 6,856,567 B2 | 2/2005 | Lee |
| 6,882,586 B2 | 4/2005 | Sato et al. |
| 7,158,434 B2 * | 1/2007 | Hokenmaier ................. 365/222 |
| 7,203,113 B2 * | 4/2007 | Takahashi et al. ............ 365/222 |
| 2003/0043673 A1 | 3/2003 | Hashimoto et al. |
| 2003/0149821 A1 | 8/2003 | Matsui et al. |
| 2003/0185078 A1 | 10/2003 | Tsukude |
| 2003/0198116 A1 | 10/2003 | Sato et al. |
| 2006/0004954 A1 | 1/2006 | Fang et al. |

OTHER PUBLICATIONS

"CellularRAM Multiplexed Async/Burst Operation," Technical Note, Micron Technology, Inc., 2005, 14 pages.

International Search Report, dated Sep. 5, 2006 (5 pages).

* cited by examiner

SYSTEM AND METHOD FOR HIDDEN-REFRESH RATE MODIFICATION

CROSS-REFERENCE TO RELATED APPLICATION

This application is a continuation of application Ser. No. 11/140,791, filed May 31, 2005, now U.S. Pat. No. 7,532,532 issued May 12, 2009.

BACKGROUND OF THE INVENTION

1. Field of the Invention

The present invention relates to electronic memories and, more particularly, to memory devices and methods for performing hidden-refreshing of volatile memory elements.

2. State of the Art

Memory cells, and in particular dynamic random access memory (DRAM) cells, need to be refreshed from time-to-time to restore leaking charge and thus maintain a logic state therein. Conventionally, a DRAM refresh process is initiated by a processor or controller coupled to the memory device by supplying an appropriate control signal to a command or control interface of the memory device. More recently, DRAMs hide some forms of refresh from the processor.

In contrast to dynamic memory devices that require periodic refreshing of the memory cells, static memory devices that do not require refreshing of the memory cells have also become commonplace. However, static random access memory (SRAM) devices require more transistors and circuitry to maintain the stored charge. Because of the additional circuitry and the increased area associated therewith, design tradeoffs are frequently undertaken to determine an appropriate form of memory for a system. One developing form of a hybrid memory device has become known as a pseudo static random access memory (PSRAM) device. Accordingly, a PSRAM device includes desirable characteristics of both DRAM devices and SRAM devices, namely, the low cost and large capacity of a DRAM device with the simplified interface and integration of an SRAM device. The PSRAM device provides an improved memory cell density by employing higher density dynamic memory cells but also requires periodic refreshing in order to maintain the stored charge at levels sufficient to determine the logic state stored therein.

To accommodate these refresh requirements, PSRAM devices incorporate refresh circuitry which is "hidden" within the memory device and thus relieves the system designer of the burden of programming a controller or processor to periodically execute the refresh process. This hidden-refresh process within PSRAM devices must be periodically performed within the PSRAM device and requires the use of an appreciable amount of power delivered to the PSRAM device for executing the necessary refresh operation. Because power management is generally of great importance for systems that integrate memory devices, there is a need to provide an improved power conservation methodology for systems that integrate memory devices that utilize hidden-refresh techniques.

BRIEF SUMMARY OF THE INVENTION

The present invention, in exemplary embodiments, relates to a system and method for modifying a hidden-refresh rate for dynamic memory cells. One embodiment of the present invention comprises a method for modifying a hidden-refresh rate of dynamic data in a memory device. A control signal identifying a request from a processor is monitored at the memory device and a hidden-refresh of dynamic data within the memory device is performed at a first refresh rate when the control signal is asserted. The dynamic data is refreshed at a second refresh rate when the control signal is deasserted for a predetermined duration.

In another embodiment of the present invention, a method for refreshing a memory device configured for hidden-refresh is provided. The method includes generating a hidden-refresh clock signal and asserting a refresh pulse when a quantity of cycles of the hidden-refresh clock signal equals a count corresponding to a first refresh rate. Addresses corresponding to an array of dynamic memory cells are generated in response to the refresh pulse. The array of dynamic memory cells identified by the address is refreshed. The count corresponding to assertion of the refresh pulse is altered to a second refresh rate when the control signal received at the memory device is deasserted for a predetermined duration.

In a further embodiment of the present invention, a hidden-refresh controller is provided. The hidden-refresh controller includes a hidden-refresh oscillator configured to generate a refresh clock and a refresh counter configured to count a quantity of cycles of the refresh clock and assert a refresh pulse when the quantity equals a defined count. The hidden-refresh controller further includes a hidden-refresh address counter configured to generate addresses corresponding to an array of dynamic memory cells in response to the refresh pulse. A mode detector is configured to modify a first refresh rate of the array of dynamic memory cells to a second refresh rate when a control signal received at the mode detector is deasserted for a predetermined duration.

In yet another embodiment of the present invention, a memory device including an array of dynamic memory cells and a hidden-refresh controller is provided. The hidden-refresh controller couples to the array of dynamic memory cells during a hidden-refresh of the array of dynamic memory cells. The hidden-refresh controller is further configured to monitor a control signal identifying a request from a processor at the memory device and refresh the dynamic data at a first refresh rate when the control signal is asserted. The hidden-refresh controller is further configured to refresh the dynamic data at a second refresh rate when the control signal is deasserted for a predetermined duration.

In yet a further embodiment of the present invention, an electronic system comprising an input device, an output device, a memory device, and processor device operably coupled to the input, output, and memory devices is provided. The memory device includes a memory array of dynamic memory cells and a hidden-refresh controller. The hidden-refresh controller includes a hidden-refresh oscillator configured to generate a refresh clock and a refresh counter configured to count a quantity of cycles of the refresh clock and assert a refresh pulse when the quantity equals a defined count. The hidden-refresh controller further includes a hidden-refresh address counter configured to generate addresses corresponding to an array of dynamic memory cells in response to the refresh pulse. A mode detector is configured to modify a first refresh rate of the array of dynamic memory cells to a second refresh rate when a control signal received at the mode detector is deasserted for a predetermined duration.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Referring in general to the following description and accompanying drawings, various aspects of the present invention are illustrated to show its structure and method of operation. Common elements of the illustrated embodiments are designated with like numerals. It should be understood the figures presented are not meant to be illustrative of actual views of any particular portion of the actual structure or method, but are merely idealized representations that are employed to more clearly and fully depict the present invention.

Figure 1:
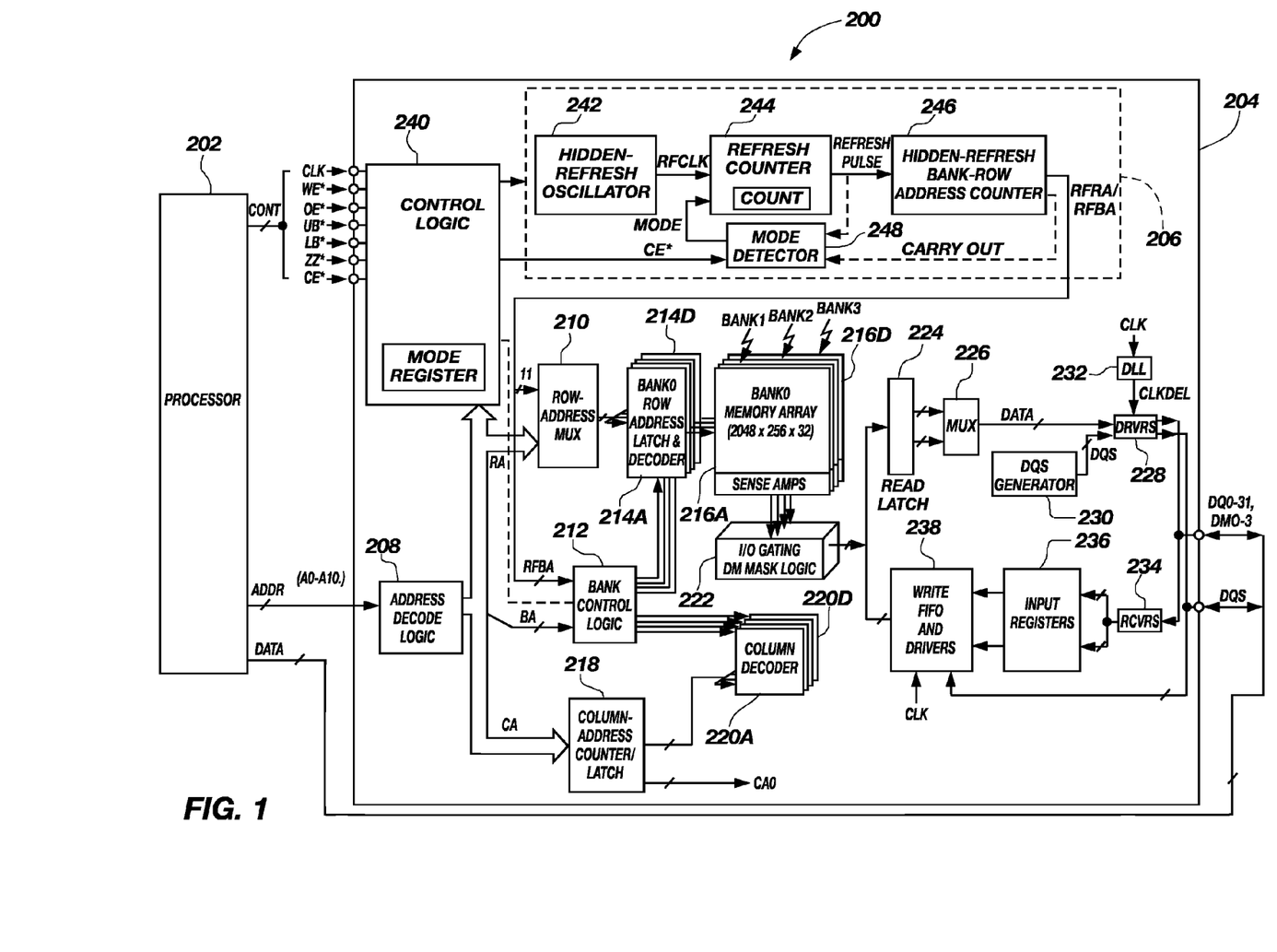
FIG. 1 is a functional block diagram of a system, including a processor and a memory device, that utilizes a hidden-refresh methodology, in accordance with an embodiment of the present invention.

FIG. 1 is a functional block diagram of a system 200 including a processor 202 coupled to a memory device 204. The memory device 204 includes a hidden-refresh controller 206 for performing refresh operations and for adjusting the refresh rate according to a detected functional state of the memory device 204 in relation to the processor 202. In operation, the hidden-refresh controller 206 initiates a hidden-refresh operation upon the dynamic storage elements (e.g., dynamic memory cells) on a periodic basis with the period being adjusted based upon the detected functional state of the memory device 204. Altering the hidden-refresh period or interval enables the memory device 204 to consume less power when conditions are conducive to adequate data retention at a lengthened refresh period. While the present embodiments are described with reference to two memory device functional modes, namely, an "active mode" and a "self-refresh mode," the invention is not so limiting. Those of ordinary skill in the art appreciate that various gradations of refresh rates or periods may be defined depending upon various factors including processor-to-memory device access frequencies, power levels, power transients, memory device fabrication process variations and techniques, as well as other conditions known and appreciated by those of ordinary skill in the art.

By way of example, and not limitation, the memory device 204 in FIG. 1 may be configured as a pseudo static random access memory (PSRAM) device configured as a dynamic random access memory (DRAM) device utilizing a hidden-refresh methodology. While one exemplary embodiment as described herein is drawn to a PSRAM device, the general principles described herein are applicable to any memory device containing memory cells that need charge replenishment through refreshing techniques (i.e., memory cells that store dynamic data, including DRAMs, SDRAMs, SLDRAMs and RDRAMs). In the following description, certain details are set forth to provide a sufficient understanding of the various embodiments of the invention. Those of ordinary skill in the art will appreciate that the invention and its various embodiments may be practiced through the use of substitution of circuits and logic with programming methodologies coupled with program-executing circuitry. Additionally, the various embodiments of the present invention may be practiced without certain details as provided. Furthermore, well-known circuits, control signals, timing protocols and other software operations are not shown herein in detail or have been entirely omitted in order to avoid unnecessarily obscuring elements of the various embodiments of the present invention.

System 200 includes a processor 202 which applies addresses A0-A10 to an address decode logic 208 over an address bus ADDR. Typically, the address decode logic 208 decodes a row address RA and a bank address BA which are applied to row address multiplexer 210 and bank control logic 212, respectively, on bus 11. The row address multiplexer 210 applies either the row address RA received from the address decode logic 208 or a refresh row address RFRA received from the hidden-refresh controller 206 to a plurality of row address latch and decoder circuits 214A-D. The bank control logic 212 activates the row address latch and decoder circuit 214A-D corresponding to either the received bank address BA or a refresh bank address RFBA from the hidden-refresh controller 206, and the activated row address latch and decoder circuit 214A-D latches that decoded the received row address. In response to the decoded row addresses, the activated row address latch and decoder circuit 214A-D applies various control signals to a corresponding memory bank or array 216A-D to thereby activate a row of memory cells corresponding to the decoded row address. The data in the memory cells in the accessed row is sensed and stored in sense amplifiers coupled to the memory bank or array 216A-D, which also refreshes the accessed memory cells as previously described. Similarly, during a refresh process, the row address multiplexer 210 applies the refresh row address RFRA to the row address latch and decoder circuits 214A-D and the bank control logic 212 uses the refresh bank address RFBA when the memory device 204 performs a hidden-refresh of the memory cells within memory bank or array 216A-D.

As stated, address decode logic 208 decodes row and bank addresses RA, BA, and a column address CA from the address received on address bus ADDR. Address decode logic 208 may provide the column address CA to a column address counter and latch circuit 218 which, in turn, latches column address CA and applies the latch column address to a plurality of column decoders 220A-D. The bank control logic 212 activates the column decoders 220A-D corresponding to the received bank address BA, and the activated column decoder decodes the column address CA from the counter and latch circuit 218. Depending upon the operational mode of memory device 204, the counter and latch circuit 218 may either directly apply the latched column address to the column decoders 220A-D, or may apply a sequence of column addresses to the decoders starting at the column address CA provided by the address decode logic 208. In response to the column address from the counter and latch circuit 218, the activated column decoders 220A-D apply decode and control signals to an I/O gating and data masking circuit 222 which, in turn, accesses memory cells corresponding to the decoded column address in the activated row of memory cells in the memory bank or array 216A-D being accessed.

Data being read during a read operation from the activated memory bank or array 216A-D may be coupled through the I/O gating and data masking circuit 222 to a read latch 224. The I/O gating and data masking circuit 222 may supply N bits of data to the read latch 224, which may then apply two N/2 bit words to a multiplexer 226. A data driver circuit 228 sequentially receives the N/2 bit words from the multiplexer 226 and also receives a data strobe signal DQS from a strobe signal generator 230 and a delayed clock signal CLKDEL from a delayed-lock loop (DLL) circuit 232. The data strobe signal DQS has the same frequency as the CLK signal and is used by the processor 202 in latching data from the memory device 204 during read operations. In response to the delayed clock signal CLKDEL, the data driver circuit 228 sequentially outputs the received N/2 bit words as corresponding data words DQ that, in a dual data rate (DDR) configuration, are synchronized with the rising and falling edges of the CLK signal, and also outputs the data strobe signal DQS having rising and falling edges in synchrony with the rising and falling edges of the CLK signal. Each data word DQ and the data strobe signal DQS collectively define a data bus DATA coupled to the processor 202 which, during read operations, latches each N/2 bit data word DQ on the data bus DATA responsive to the data strobe signal DQS.

The processor 202 during data write operations applies N/2 bit data words DQ, the data strobe signal DQS on the data bus DATA. The data receiver circuit 234 receives each data word DQ and applies these to an input register 236 that is clocked by the data strobe signal DQS. In a dual data rate (DDR) example and in response to the rising edge of the DQS signal, input register 236 latches a first N/2 bit DQ word and in response to a falling edge of the DQS signal, the input register 236 latches the corresponding N/2 bit DQ word. Input register 236 provides the two latched N/2 bit DQ words as an N-bit word to a write FIFO and driver circuit 238, which clocks the applied DQ word into the write FIFO and driver circuit 238 in response to the DQS signal. The DQS word is clocked out of the write FIFO and driver circuit 238 in response to the CLK signal, and then is applied to the I/O gating and data masking circuit 222. The I/O gating and data masking circuit 222 transfers the DQ word to the accessed memory cells in the active memory bank or array 216A-D. While the present illustration is drawn to support a dual data rate, the various embodiments also contemplate lesser and greater data rates.

Control logic 240 receives a plurality of command and clocking signals from a processor 202 over a control bus CONT, and generates a plurality of control and timing signals to control the various memory device components 206-238 during operation of the memory device 204. The command signals may include a chip enable signal CE*, a write enable signal WE*, an output enable signal OE*, a lower byte enable signal LB*, an upper byte enable signal UB*, a clock signal CLK, and may optionally include other control signals, such as a sleep enable signal ZZ*. One or more of the aforementioned signals may further include corresponding complementary signals, with the "*" designating a signal as being active when asserted low. When interfaced, processor 202 drives the command signals CE*, WE* to values corresponding to a particular command such as a read or write operation. In response to the clock signal CLK, the control logic circuit 240 latches and decodes an applied command and generates a sequence of control signals that control various components in the memory device 204 to execute the function of the applied command. By way of example and not limitation, the control logic circuit 240 latches command and address signals at positive edges of the CLK signal, while the input registers 236 and data driver circuits 228 may transfer data into and from the memory device 204 in response to either one or both edges of the data strobe signal DQS. When data transfer occurs on both edges of the clock signals CLK, memory device 204 may be referred to as a dual data rate (DDR) device with data being transferred to and from the memory device 204 at double the rate of a conventional SRAM, which transfers data at a rate corresponding to the frequency of the applied clock signal.

As previously stated, PSRAM memory devices generally find application to low-power portable applications while providing high-density memory storage. Memory device 204 performs on-chip refresh operations, generally noted herein as a hidden-refresh of the dynamic memory cells within memory bank or array 216A-D. The hidden-refresh process performed by hidden-refresh controller 206 requires no additional support from a system memory controller. Furthermore, in low-power portable applications, special attention is given to operational power consumption in the memory device 204 during the hidden-refresh process. The hidden-refresh controller 206 detects the need for refreshing the data stored within the memory bank or array 216A-D to prevent the loss of the data logic states due to leakage currents associated with dynamic memory elements.

Generally, the hidden-refresh controller 206 includes a hidden-refresh oscillator 242 configured to generate a hidden-refresh clock signal RFCLK. The RFCLK signal provides a reference frequency for counting a quantity of clocks to determine a refresh interval or period. Hidden-refresh controller 206 further includes a hidden-refresh counter 244 coupled to the RFCLK signal of the hidden-refresh oscillator 242. Hidden-refresh counter 244 counts a specific quantity of cycles of the RFCLK signal to determine when to assert a REFRESH PULSE signal. A refresh period or rate is determined for maintaining the stored charge within the memory bank or array 216A-D. The frequency of the REFRESH PULSE signal is a function of a defined threshold COUNT for each of the modes defined within the hidden-refresh counter 244. Hidden-refresh controller 206 further includes a hidden-refresh address counter 246 configured to generate refresh addresses (e.g., refresh row addresses RFRA and refresh bank addresses RFBA) in response to a REFRESH PULSE.

The hidden-refresh counter 244 is configurable by a mode detector 248 which determines if the memory device 204 is in one of at least two hidden-refresh modes, namely, (i) an active mode, wherein data is being or has recently been transferred between processor 202 and memory elements within the memory bank or array 216A-D, or (ii) a self-refresh mode wherein an inactivity duration of the exchange of information between processor 202 and memory elements of the memory bank or array 216A-D has been detected. The memory device 204, when actively exchanging data with the processor 202, defaults to an active mode of the hidden-refresh process. The active mode of the hidden-refresh process provides for a more frequent execution of the refresh operation to mitigate data loss due to conditions such as voltage bumps or transients, moving inversions through the array, or long RAS low conditions that induce charge leakage in the dynamic memory cell.

To place the memory device 204 in a hidden-refresh mode of operation, the hidden-refresh counter 244 detects achievement of a COUNT quantity of RFCLK signals corresponding to the current hidden-refresh mode (e.g., active mode or self-refresh mode), which causes the commencement of a hidden-refresh operation. In response, the hidden-refresh controller 206 applies control signals to the row address multiplexer 210 and the bank control logic 212, which cause the circuits to utilize the refresh row address RFRA and refresh bank address RFBA from the hidden-refresh controller 206 to sequentially access each row of memory cells in the memory bank or array 216A-D and thereby refresh the memory cells. The hidden-refresh controller 206 controls the refresh rate at which the memory cells in the memory bank or array 216A-D are refreshed as a function of the determined memory device functional mode (e.g., active mode or self-refresh mode) as determined by mode detector 248 within hidden-refresh controller 206.

As stated, the hidden-refresh controller 206 includes a mode detector 248 that monitors one or more signals within memory device 204 to determine conditions that are conducive to the various functional modes. As stated, it is desirable to conserve power within system 200, therefore, when mode detector 248 determines conditions under which the hidden-refresh rate of the memory cells of memory bank or array 216A-D may be reduced and still retain data integrity, mode detector 248 signals a change in the hidden-refresh mode from the higher, or more frequent, refresh rate "active mode" to the less frequent refresh rate of "self-refresh mode." When the mode detector 248 determines a specific hidden-refresh mode, the mode detector 248 asserts a MODE signal to the hidden-refresh counter 244 to utilize a corresponding value of COUNT for determining when to assert the REFRESH PULSE signal.

In operation, upon the generation of a REFRESH PULSE signal from the hidden-refresh counter 244, the hidden-refresh controller 206 applies control signals causing the row address multiplexer 210 and the bank control logic 212 to utilize the refresh row address RFRA and refresh bank addresses RFBA, respectively. The hidden-refresh oscillator 242 may apply the refresh clock signal RFCLK to clock the hidden-refresh address counter 246, which, in turn, sequentially generates the refresh row addresses RFRA and refresh bank addresses RFBA. The sequentially generated refresh row addresses RFRA are applied through the row address multiplexer 210 and latched and decoded by the activated row address latch and decoder circuit 214A-D, with the circuit of the bank control logic 212 activating the row address latch and decoder circuit 214A-D corresponding to the refresh bank address RFBA. The hidden-refresh controller 206 generates a given refresh bank address RFBA and then generates refresh row addresses RFRA to sequentially activate all rows in the memory bank or array 216A-D corresponding to the bank address, and thereafter generates a new bank address and activates each row in the newly selected memory address, and so on for each memory array. In this manner, the hidden-refresh controller 206 sequentially activates rows of memory cells in the memory bank or array 216A-D to thereby refresh the memory cells. The refresh rate of the memory cells in the memory bank or array 216A-D is determined by the rate at which the hidden-refresh counter 244 reaches the currently defined COUNT corresponding to the current functional refresh mode as conveyed to the hidden-refresh counter 244 by the MODE signal.

Figure 2:
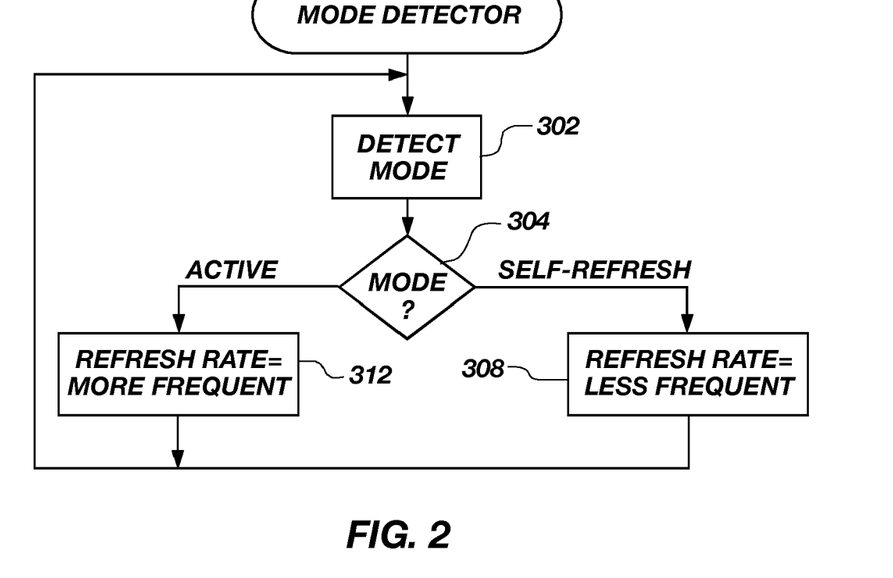
FIG. 2 is a flowchart of a mode detector for determining a functional state or mode of a memory device incorporating hidden-refresh techniques, in accordance with an embodiment of the present invention.

Mode detector 248 may be configured according to one or more of the embodiments of the present invention as illustrated with reference to FIGS. 3-8. Generally, mode detector 248 functions according to the flowchart of FIG. 2. In FIG. 2, the mode detector 248 (FIG. 1) monitors various signals to detect 302 specific conditions under which one refresh functional mode should be defined. The mode is identified 304 as either an active mode where the refresh rate is performed more frequently 312, or a self-refresh mode where the refresh rate may be performed less frequently 308 in order to contribute to the conservation of power in system 200 (FIG. 1). The conditions that define the various modes are continually monitored to determine when the modes may be changed to conserve power or when the modes should be changed in order to preserve data integrity.

Figure 3:
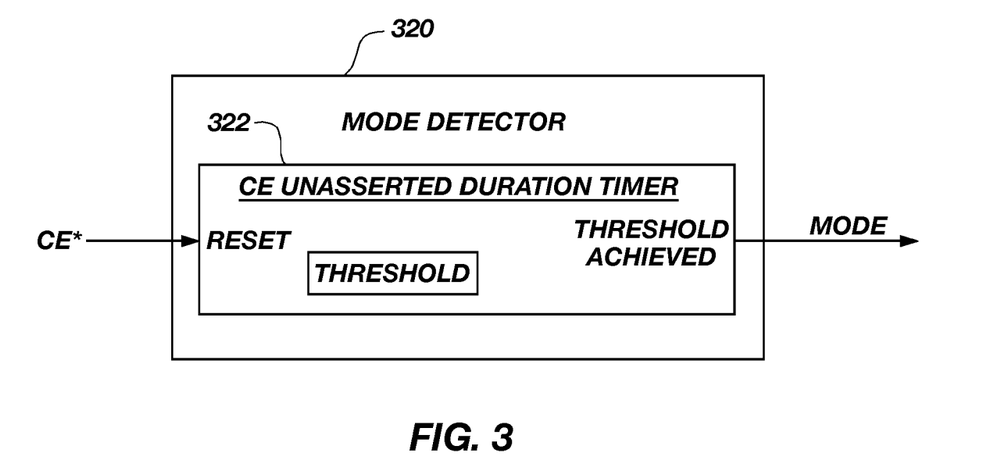
FIG. 3 is a memory device mode detector configured according to the flowchart of FIG. 4 to set a hidden-refresh mode of a memory device, in accordance with an embodiment of the present invention.
Figure 4:
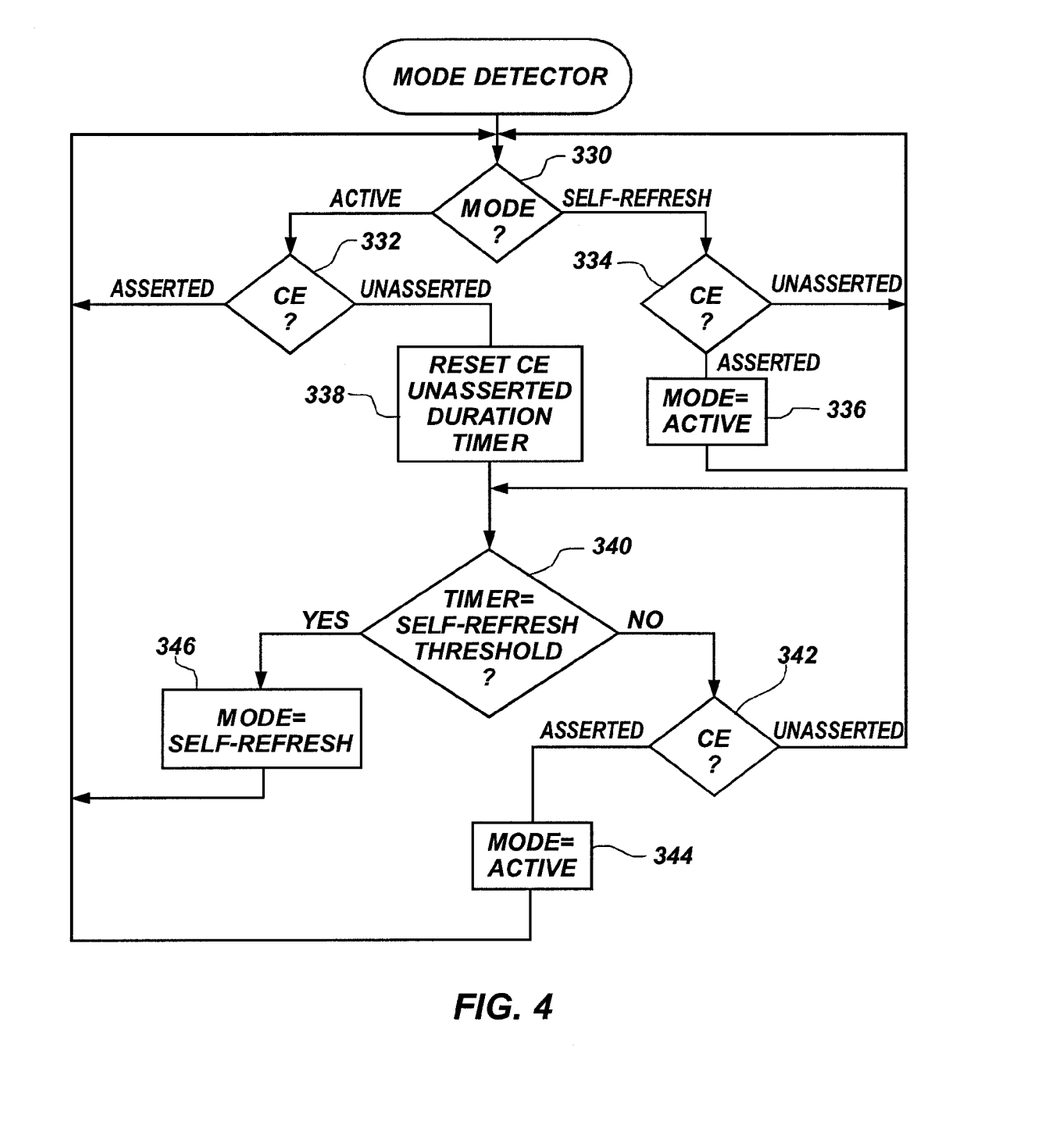
FIG. 4 is the corresponding flowchart for detecting the mode of the memory device mode detector of FIG. 3, in accordance with the present embodiment of the invention.

FIG. 3 illustrates a logic block of a hidden-refresh mode detector 320 functioning according to the flowchart of FIG. 4, in accordance with an embodiment of the present invention. Referring to both FIGS. 3 and 4, the hidden-refresh mode of either active or self-refresh is determined from analyzing a control signal, such as the chip enable signal CE*, to determine a state and duration associated therewith. In the present embodiment, if the chip enable signal CE* remains unasserted for more than a predetermined delay, then the MODE signal will indicate the memory device 204 (FIG. 1) should be configured in a self-refresh mode designating conditions conducive for stretching or lengthening the hidden-refresh duration. By way of implementation, the mode detector 320 includes an element 322 that may be configured in various manners, including as a resettable delay element that propagates the chip enable signal CE* until it arrives at the output of the delay element. In another configuration, element 322 may be configured as a resettable timer or counter that compares a count against a threshold or other value until the count equals the threshold and the MODE signal designates the determined hidden-refresh mode.

FIG. 4 is the corresponding flowchart for detecting the mode, in accordance with the present embodiment of the invention. A hidden-refresh mode detector 320 (FIG. 3) evaluates 330 the current mode. If the current mode is active, then the state of chip enable signal CE* is determined 332. If chip enable signal CE* is asserted, this is an indication that ongoing accesses to the memory device 204 (FIG. 1) are being performed by the processor 202 (FIG. 1). Accordingly, power transients and other memory array access conditions demand a more frequent refresh of the memory cells and the MODE remains set to active and processing returns to evaluating 330 the functional mode and any forthcoming inactivity in the memory device 204 as indicated by an unasserted control signal, such as the chip enable signal CE*.

When the mode is evaluated 330 and determined to be self-refresh, then the state of chip enable signal CE* is determined 334. If chip enable signal CE* remains unasserted, this is an indication of ongoing or sustained inactivity between the memory device 204 and the processor 202. Accordingly, any power transients and other memory array access conditions are diminished and a less frequent refresh of the memory cells remains adequate for retention of the resident logic states resulting in the MODE remaining set to self-refresh with processing returning to an evaluation 330 of the mode and any forthcoming activity in the memory device 204 as indicated by, for example, an asserted chip enable signal CE*.

Determination 334 of an asserted chip enable signal CE* indicates that accesses to the memory device 204 have been resumed and are being performed by processor 202. Accordingly, power transients and other memory array access conditions likely require a more frequent refresh of the memory cells and, therefore, the MODE is set 336 to indicate an active mode and processing returns to evaluating 330 the mode and a determination 332 of any forthcoming inactivity in the memory device 204 as indicated, for example, by an unasserted chip enable signal CE*.

When the mode is evaluated 330 and determined to be active and the state of chip enable signal CE* is determined 332 to be unasserted, then the element 322 (FIG. 3) is reset 338 through clearing of the delay line, resetting a duration timer/counter or other similar duration measuring element. The achievement of a duration or threshold of the element 322 is measured 340. While the threshold is unachieved, the chip enable signal CE* is continuously monitored 342 and while the chip enable signal CE* remains unasserted, processing continues to return to measure 340 the timer/counter element 322 against the threshold. As stated, while measuring 340 for the achievement of the threshold, the chip enable signal CE* is monitored 342. If the chip enable signal CE* becomes asserted, then the MODE is set 344 to indicate the active mode and processing returns to evaluating 330 the mode and for determining 332 any forthcoming inactivity in the memory device 204 as indicated, for example, by an unasserted chip enable signal CE*.

When the achievement of a duration or threshold of the element 322 is measured 340 and the threshold is achieved, the MODE is set 346 to indicate the self-refresh mode and processing returns to evaluating 330 the mode and for determining 334 any forthcoming activity in the memory device 204 as indicated by an asserted chip enable signal CE*.

While the present embodiment has utilized the chip enable signal CE* as an indicator of activity and inactivity between the processor 202 (FIG. 1) and the memory device 204 (FIG. 1), other control or address signals may be employed to indicate interaction or the lack thereof between the processor 202 and the memory device 204. Such modifications and adaptations are considered to be within the scope of the present embodiment of the invention.

Figure 5:
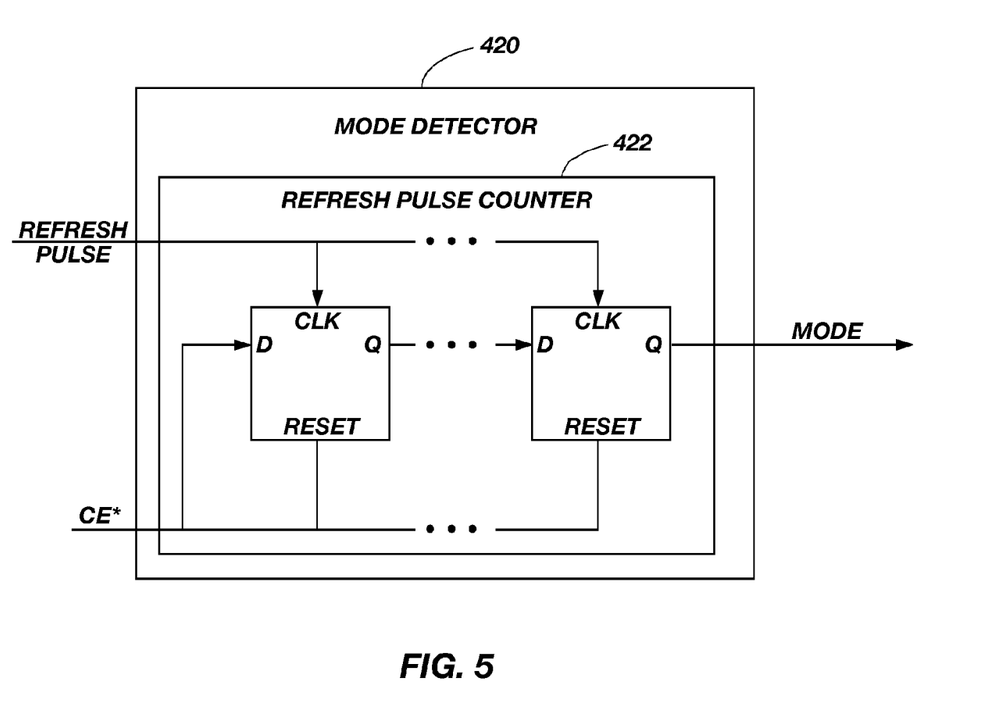
FIG. 5 is a memory device mode detector configured according to the flowchart of FIG. 6 to set a hidden-refresh mode of a memory device, in accordance with another embodiment of the present invention.
Figure 6:
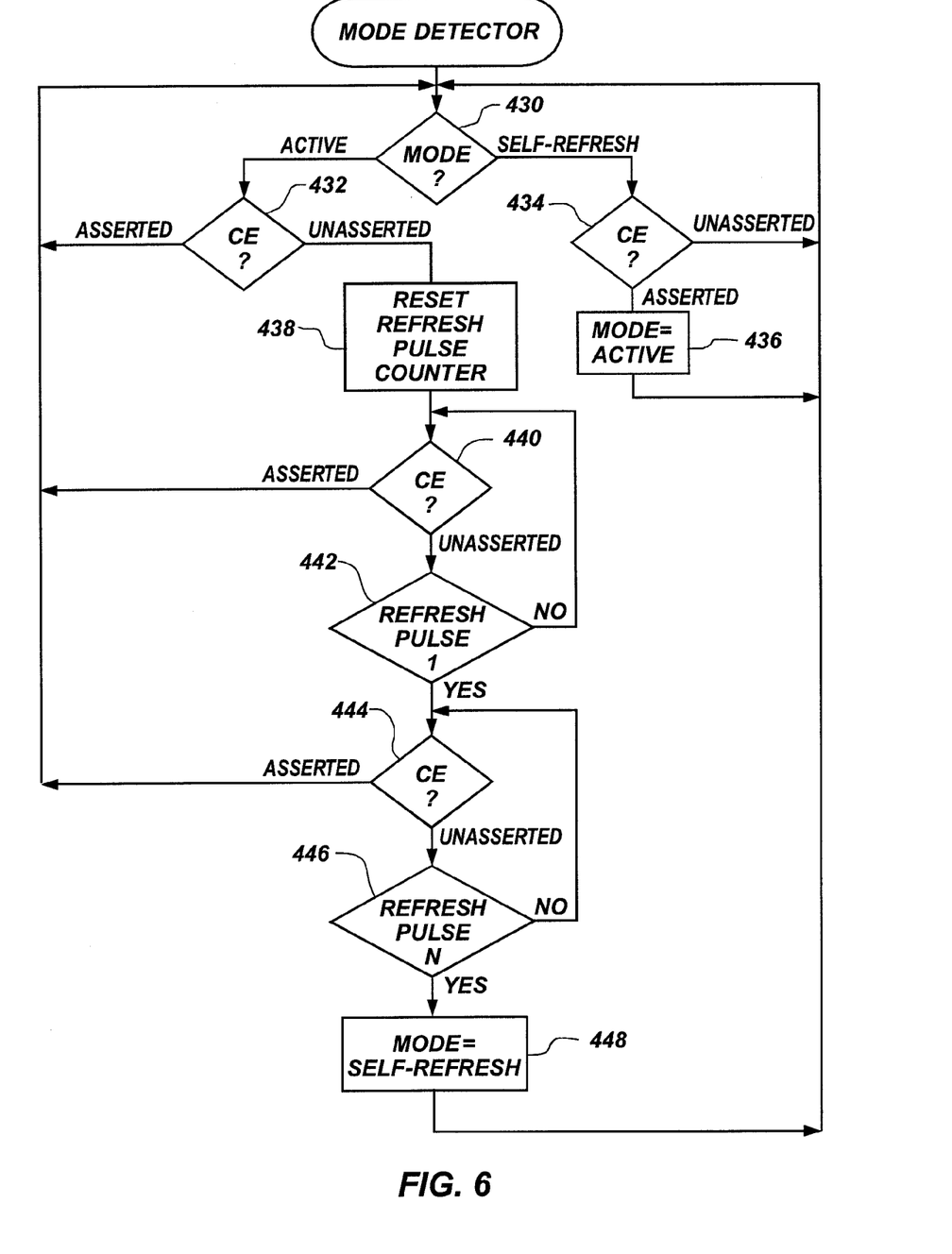
FIG. 6 is the corresponding flowchart for detecting the mode of the memory device mode detector of FIG. 5, in accordance with the present embodiment of the invention.

FIG. 5 illustrates a logic block of a hidden-refresh mode detector 420 functioning according to the flowchart of FIG. 6, in accordance with another embodiment of the present invention. Referring to both FIGS. 5 and 6, the functional refresh mode of either active mode or self-refresh mode is determined from analyzing the REFRESH PULSE signal to determine a pulse and consecutive occurrences of the pulse. In the present embodiment, if the refresh pulse counter 422 detects a series of consecutive occurrences of the REFRESH PULSE signal, then the MODE signal will indicate that the memory device 204 (FIG. 1) should be configured in a self-refresh mode designating conditions conducive for stretching or lengthening the hidden-refresh duration. By way of implementation, the hidden-refresh mode detector 420 includes a refresh pulse counter 422 that may be configured in various manners, including as a series of resettable latches that are clocked to propagate the chip enable signal CE* until the signal arrives at the output of the refresh pulse counter 422.

FIG. 6 is the corresponding flowchart for detecting the mode, in accordance with the present embodiment of the invention. A hidden-refresh mode detector 420 (FIG. 5) evaluates 430 the current mode. If the current mode is active, then the state of chip enable CE* signal is determined 432. If chip enable signal CE* is asserted, this is an indication that ongoing accesses to the memory device 204 (FIG. 1) are being performed by the processor 202 (FIG. 1). Accordingly, power transients and other memory array access conditions may demand a more frequent refresh of the memory cells. Therefore, the MODE remains set to indicate the active mode and processing returns to evaluating 430 the mode and any forthcoming inactivity in the memory device 204. Inactivity in the memory device 204 may be indicated by an unasserted chip enable signal CE* resulting in a release of the latches of refresh pulse counter 422 (FIG. 5) from a reset state.

When the mode is evaluated 430 and determined to be self-refresh, then the state of the chip enable signal CE* is determined 434. If the chip enable signal CE* remains unasserted indicating ongoing inactivity between the memory device 204 and the processor 202, the effect of power transients and other memory array access conditions are diminished and a less frequent refresh of the memory cells may be adequate for retention of the resident logic states. Accordingly, the MODE remains set to indicate the self-refresh mode with processing returning to evaluate 430 the mode and any forthcoming activity in the memory device 204 as indicated by an asserted chip enable signal CE*.

Determination 434 of an asserted chip enable signal CE* indicates that accesses to the memory device 204 have been resumed and are being performed by processor 202. Accordingly, power transients and other memory array access conditions likely require a more frequent refresh of the memory cells and, therefore, the MODE is set 436 to indicate an active mode and processing returns to evaluating 430 the mode and a determination 432 of any forthcoming inactivity in the memory device 204 as indicated, for example, by an unasserted chip enable signal CE*.

When the mode is evaluated 430 and determined to be active and the state of chip enable signal CE* is determined 432 to be unasserted, then the refresh pulse counter 422 (FIG. 5) is released from reset 438 (i.e., the latches are released from being held reset and therefore inhibiting propagation of a signal). The propagation of an unasserted chip enable signal CE* through the series of latches within refresh pulse counter 422 (FIG. 5) occurs unless the chip enable signal CE* becomes asserted and causes the suspension of propagation through the latches. The chip enable signal CE* is monitored 440 and if the chip enable signal CE* becomes asserted, then the MODE remains in the active state and processing returns to evaluating 430 the mode and for determining 432 any forthcoming inactivity in the memory device 204 as indicated by an unasserted chip enable signal CE*. If the chip enable signal CE* remains unasserted, then detection 442 of a first refresh pulse is performed. If the first refresh detection pulse is not detected, then processing returns to monitor 440 for assertion of the chip enable signal CE* causing the MODE to continue indicating the active mode and processing returns to evaluate 430 the mode and to determine 432 any forthcoming inactivity in the memory device 204 as indicated by an unasserted chip enable signal CE*.

When a first refresh pulse is detected 442, the process of monitoring 444 for the assertion of the chip enable signal CE* and the detection 446 continues. It should be noted that in the block diagram of FIG. 5 and in the flowchart of FIG. 6, two distinct latches and two distinct monitor chip enable/detect refresh pulse steps sequences are depicted. It should be appreciated that any quantity of consecutive refresh pulse counts may be selected before conditions are deemed acceptable for transitioning from an active mode of hidden-refresh to a self-refresh mode. The quantity of two is merely illustrative and not to be considered as limiting.

When the unasserted chip enable signal CE* has propagated through refresh pulse counter 422 (FIG. 5), the MODE is set 448 to indicate the self-refresh mode and processing returns to evaluating 430 the mode and for determining 434 any forthcoming activity in the memory device 204 (FIG. 1) as indicated by an asserted chip enable signal CE*.

As stated, while the present embodiment has utilized the chip enable signal CE* as an indicator of activity/inactivity between the processor 202 (FIG. 1) and the memory device 204 (FIG. 1), other control or address signals may be employed to indicate interaction or the lack thereof between the processor 202 and the memory device 204. Such modifications and adaptations are considered to be within the scope of the present embodiment of the invention.

Figure 7:
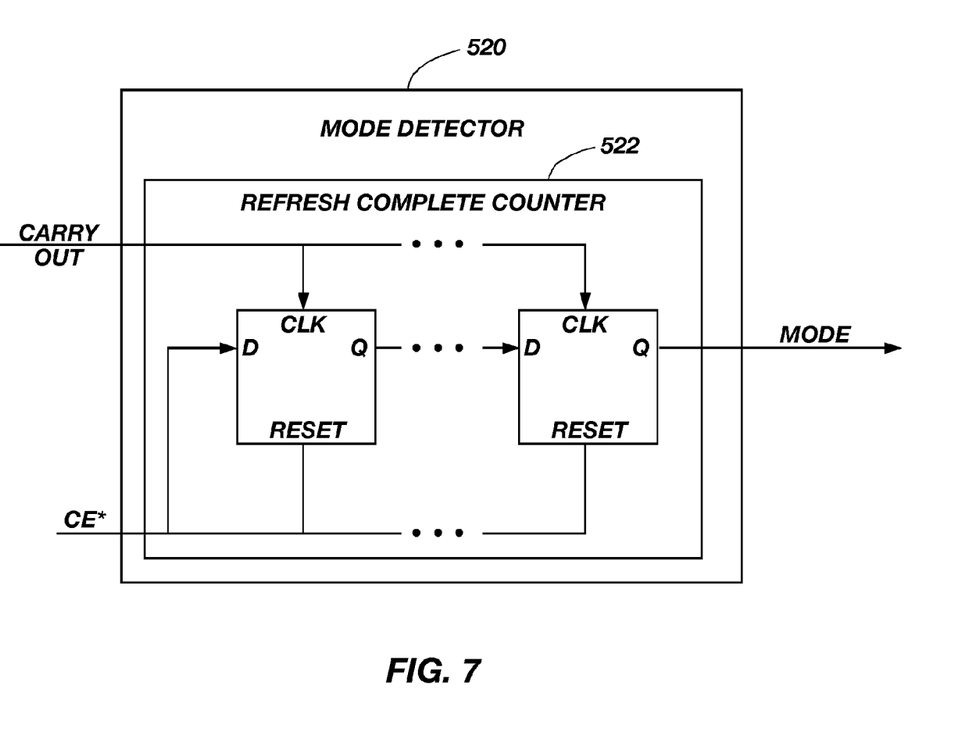
FIG. 7 is a memory device mode detector configured according to the flowchart of FIG. 8 to set a hidden-refresh mode of a memory device, in accordance with a further embodiment of the present invention.
Figure 8:
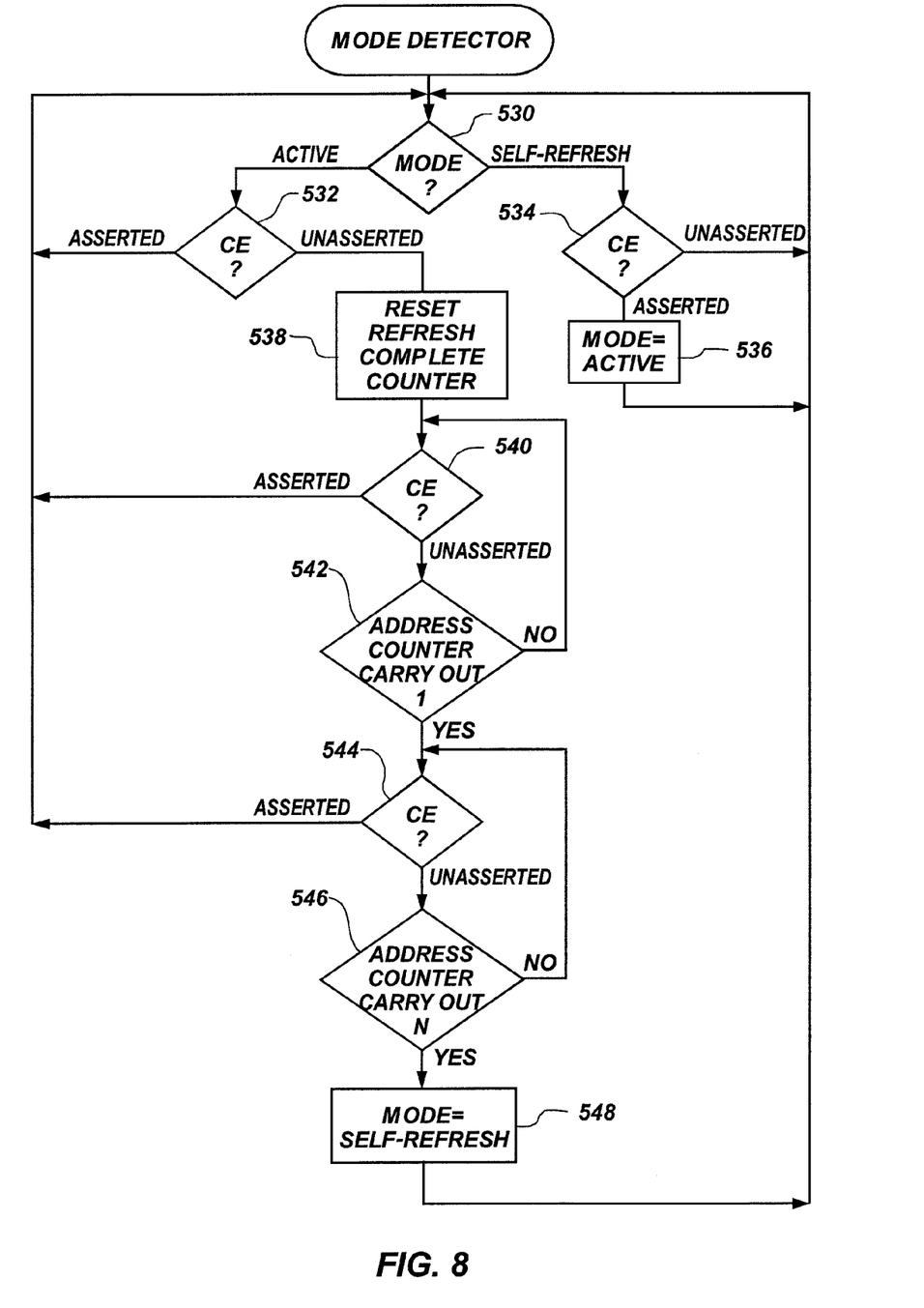
FIG. 8 is the corresponding flowchart for detecting the mode of the memory device mode detector of FIG. 7, in accordance with the present embodiment of the invention.

FIG. 7 illustrates a logic block of a hidden-refresh mode detector 520 functioning according to the flowchart of FIG. 8, in accordance with an embodiment of the present invention. Referring to both FIGS. 7 and 8, the functional refresh mode of either active mode or self-refresh mode is determined from analyzing a refresh complete signal, an example of which is a CARRY OUT signal from the hidden-refresh address counter 246 (FIG. 1) to determine consecutive occurrences of a completed refresh operation. In the present embodiment, if a refresh complete counter 522 detects a series of consecutive occurrences of the CARRY OUT signal, then the MODE signal will indicate the memory device 204 (FIG. 1) should be configured in a self-refresh mode designating conditions conducive for stretching or lengthening the hidden-refresh duration. By way of implementation, the mode detector 520 includes a refresh complete counter 522 that may be configured in various manners, including as a series of resettable latches that are clocked to propagate the chip enable signal CE* until the signal arrives at the output of the refresh complete counter 522.

FIG. 8 is the corresponding flowchart for detecting the mode, in accordance with the present embodiment of the invention. A hidden-refresh mode detector 520 (FIG. 7) evaluates 530 the current mode. If the current mode is active, then the state of chip enable signal CE* is determined 532. If chip enable signal CE* is asserted, this is an indication that ongoing accesses to the memory device 204 (FIG. 1) are being performed by the processor 202 (FIG. 1). Accordingly, power transients and other memory array access conditions may demand a more frequent refresh of the memory cells. Therefore, the MODE remains set to indicate the active mode and processing returns to evaluating 530 the mode and any forthcoming inactivity in the memory device 204. Inactivity in the memory device 204 may be indicated by an unasserted chip enable signal CE* resulting in a release of the latches of refresh complete counter 522 (FIG. 7) from a reset state.

When the mode is evaluated 530 and determined to be self-refresh, then the state of the chip enable signal CE* is determined 534. If the chip enable signal CE* remains unasserted indicating ongoing inactivity between the memory device 204 and the processor 202, the effect of power transients and other memory array access conditions are diminished and a less frequent refresh of the memory cells may be adequate for retention of the resident logic states. Accordingly, the MODE remains set to indicate the self-refresh mode with processing returning to evaluate 530 the mode and any forthcoming activity in the memory device 204 as indicated by an asserted chip enable signal CE*.

Determination 534 of an asserted chip enable signal CE* indicates that accesses to the memory device 204 have been resumed and are being performed by processor 202. Accordingly, power transients and other memory array access conditions likely require a more frequent refresh of the memory cells and, therefore, the MODE is set 536 to indicate an active mode and processing returns to evaluating 530 the mode and a determination 532 of any forthcoming inactivity in the memory device 204 as indicated, for example, by an unasserted chip enable signal CE*.

When the mode is evaluated 530 and determined to be active and the state of chip enable signal CE* is determined 532 to be unasserted, then the refresh complete counter 522 (FIG. 7) is released from reset 538 (i.e., the latches are released from being held reset and therefore inhibiting propagation of a signal). The propagation of an unasserted chip enable signal CE* through the series of latches within refresh complete counter 522 (FIG. 5) occurs unless the chip enable signal CE* becomes asserted and causes the suspension of propagation through the latches. The chip enable signal CE* is monitored 540 and if the chip enable signal CE* becomes asserted, then the MODE remains in the active state and processing returns to evaluating 530 the mode and for determining 532 any forthcoming inactivity in the memory device 204 as indicated by an unasserted chip enable signal CE*. If the chip enable signal CE* remains unasserted, then detection 542 of a first refresh complete, namely a CARRY OUT, signal is performed. If the first CARRY OUT signal is not detected, then processing returns to monitor 540 for assertion of the chip enable signal CE* causing the MODE to continue indicating the active mode and processing returns to evaluate 530 the mode and to determine 532 any forthcoming inactivity in the memory device 204 as indicated by an unasserted chip enable signal CE*.

When a first CARRY OUT signal is detected 542, the process of monitoring 544 for the assertion of the chip enable signal CE* and the detection 546 continues. It should be noted that in the block diagram of FIG. 7 and in the flowchart of FIG. 8, two distinct latches and two distinct monitor chip enable/detect CARRY OUT steps sequences are depicted. It should be appreciated that any quantity of consecutive CARRY OUT counts may be selected before conditions are deemed acceptable for transitioning from an active mode of hidden-refresh to a self-refresh mode. The quantity of two is merely illustrative and not to be considered as limiting.

When the unasserted chip enable signal CE* has propagated through refresh complete counter 522 (FIG. 7), the MODE is set 548 to indicate the self-refresh mode and processing returns to evaluating 530 the mode and for determining 534 any forthcoming activity in the memory device 204 as indicated by an asserted chip enable signal CE*.

As stated, while the present embodiment has utilized the chip enable signal CE* as an indicator of activity/inactivity between the processor 202 (FIG. 1) and the memory device 204 (FIG. 1), other control or address signals may be employed to indicate interaction or the lack thereof between the processor 202 and the memory device 204. Such modifications and adaptations are considered to be within the scope of the present embodiment of the invention.

Figure 9:
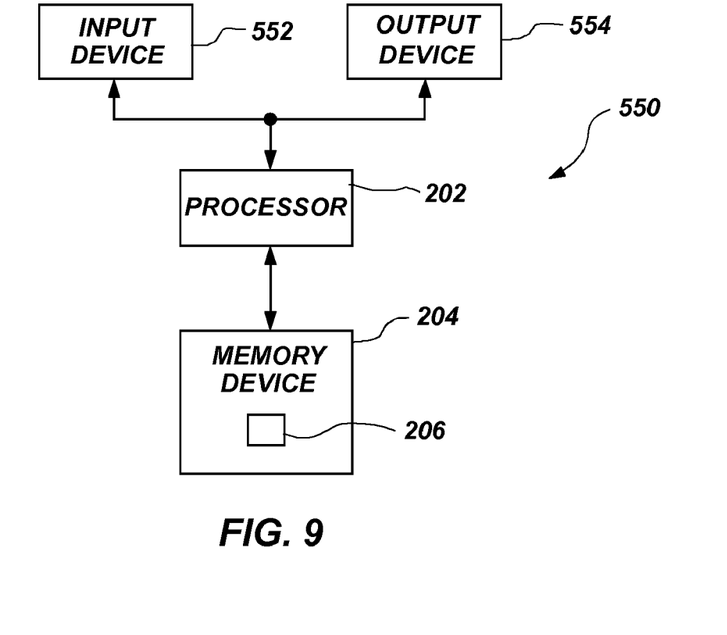
FIG. 9 is a block diagram of an electronic system including a memory device configured with the hidden-refresh circuitry described herein, in accordance with yet another embodiment of the present invention.

FIG. 9 is a block diagram of an electronic system including a memory device configured in accordance with an embodiment of the present invention. An electronic system 550 includes an input device 552, an output device 554, a processor 202, and a memory device 204 incorporating a hidden-refresh controller 206, as described above with reference to FIGS. 1-8.

Figure 10:
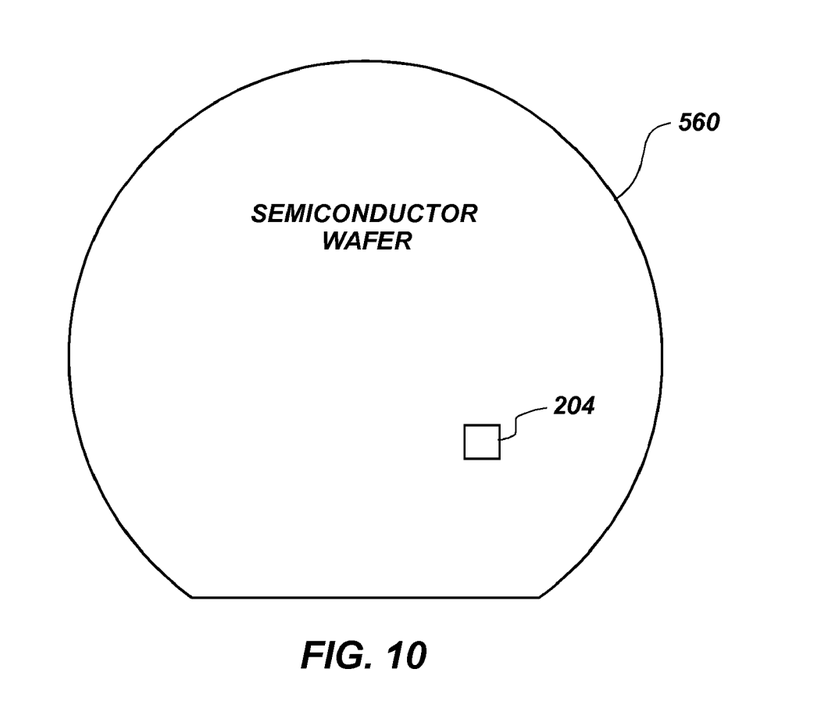
FIG. 10 is a diagram of a semiconductor wafer including a memory device configured with the hidden-refresh circuitry described herein, in accordance with yet a further embodiment of the present invention.

As shown in FIG. 10, the memory device 204 of FIGS. 1-8 may be fabricated on a semiconductor wafer 560. Of course, it should be understood that semiconductor substrates other than a semiconductor wafer also fall within the scope of the present invention, including, for example, Silicon-On-Sapphire (SOS) substrates and Silicon-On-Glass (SOG) substrates.

Although the present invention has been described with reference to particular embodiments, the invention is not limited to these described embodiments. Rather, the invention is limited only by the appended claims, which include within their scope all equivalent devices or methods that operate according to the principles of the inventions as described.

What is claimed is:

1. A method for modifying a hidden-refresh rate of dynamic data in a memory device, comprising:
   receiving a control signal at a memory device from a processor;
   timing deassertion of the control signal;
   internally generating a hidden-refresh rate within the memory device for refreshing the memory device; and
   extending the hidden-refresh rate when the deassertion of the control signal exceeds a predetermined duration.

2. The method of claim 1, wherein the control signal is a chip enable signal initiated by the processor.

3. The method of claim 1, wherein timing deassertion of the control signal further comprises measuring a quantity of refresh pulses while the control signal is deasserted to determine the predetermined duration.

4. The method of claim 1, wherein timing deassertion of the control signal further comprises measuring a quantity of refresh complete signals while the control signal is deasserted to determine the predetermined duration.

5. A method for refreshing a memory device configured for hidden-refresh, comprising:
   refreshing an array of dynamic memory cells at a hidden-refresh rate internally generated within a hidden-refresh controller of a memory device;
   receiving a control signal at the memory device from a processor; and
   extending the hidden-refresh rate when deassertion of the control signal exceeds a predetermined duration.

6. The method of claim 5, wherein the control signal is a chip enable signal initiated by the processor.

7. The method of claim 5, wherein extending the hidden-refresh rate further comprises measuring a quantity of consecutive occurrences of a refresh pulse while the control signal is deasserted to determine the predetermined duration.

8. The method of claim 5, further comprising measuring a quantity of consecutive occurrences of refreshing the array of dynamic memory cells while the control signal is deasserted to determine the predetermined duration.

9. A hidden-refresh controller, comprising:
   a hidden-refresh oscillator configured to generate a refresh clock independent of a system memory controller;
   a hidden-refresh counter configured to count a quantity of cycles of the refresh clock and assert a refresh pulse when the quantity equals a defined count;
   a hidden-refresh address counter configured to generate addresses corresponding to an array of dynamic memory cells in response to the refresh pulse; and
   a mode detector configured to extend the defined count to internally extend a refresh rate of the refresh clock when deassertion of a control signal received at a memory device exceeds a predetermined duration.

10. The hidden-refresh controller of claim 9, wherein the control signal is a chip enable signal received at the hidden-refresh controller.

11. The hidden-refresh controller of claim 9, wherein the predetermined duration is determined by timing the control signal when deasserted against a duration threshold.

12. The hidden-refresh controller of claim 9, wherein the predetermined duration is determined by measuring a quantity of consecutive occurrences of the refresh pulse while the control signal is deasserted.

13. The hidden-refresh controller of claim 9, wherein the predetermined duration is determined by measuring a quantity of consecutive occurrences of refreshing the array of dynamic memory cells while the control signal is deasserted.

14. A memory device, comprising:
   an array of dynamic memory cells; and
   a hidden-refresh controller couplable to the array of dynamic memory cells during a hidden-refresh of the array of dynamic memory cells, the hidden-refresh controller configured to internally refresh the array of dynamic memory cells independent of a system memory controller at a hidden-refresh rate, and extend the hidden-refresh rate when deassertion of a control signal received at the memory device exceeds a predetermined duration.

15. The memory device of claim 14, wherein the control signal is a chip enable signal received at the hidden-refresh controller.

16. The memory device of claim 14, wherein the predetermined duration is determined by timing the control signal when deasserted against a duration threshold.

17. The memory device of claim 14, wherein the predetermined duration is determined by measuring a quantity of consecutive occurrences of a refresh pulse while the control signal is deasserted.

18. The memory device of claim 14, wherein the predetermined duration is determined by measuring a quantity of consecutive occurrences of refreshing the array of dynamic memory cells while the control signal is deasserted.

* * * * *